US011552618B2

(12) United States Patent
Park

(10) Patent No.: US 11,552,618 B2
(45) Date of Patent: Jan. 10, 2023

(54) ADAPTIVE IMPEDANCE MATCHING APPARATUS AND METHOD FOR WIRELESS POWER TRANSFER

(71) Applicant: HYUNDAI MOBIS CO., LTD., Seoul (KR)

(72) Inventor: Jong Hyuk Park, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/550,446

(22) Filed: Dec. 14, 2021

(65) Prior Publication Data
US 2022/0190809 A1 Jun. 16, 2022

(30) Foreign Application Priority Data
Dec. 15, 2020 (KR) .......................... 10-2020-0175910

(51) Int. Cl.
*H03H 11/28* (2006.01)
*H02J 50/12* (2016.01)

(52) U.S. Cl.
CPC ............. *H03H 11/28* (2013.01); *H02J 50/12* (2016.02)

(58) Field of Classification Search
CPC .. H03H 11/28; H03H 7/38; H03H 7/40; H02J 50/12; H01F 38/14
See application file for complete search history.

(56) References Cited

U.S. PATENT DOCUMENTS

| 5,483,680 A * | 1/1996 | Talbot | H03H 7/40 455/107 |
| 7,110,435 B1 * | 9/2006 | Sorrells | H03D 7/00 375/147 |
| 2005/0093624 A1 * | 5/2005 | Forrester | H04B 1/3838 330/129 |
| 2012/0080957 A1 * | 4/2012 | Cooper | H04B 5/0037 307/104 |
| 2012/0153739 A1 * | 6/2012 | Cooper | H02J 50/23 307/104 |

(Continued)

FOREIGN PATENT DOCUMENTS

WO WO-2015177075 A1 * 11/2015 ............. G05B 11/06

*Primary Examiner* — Jared Fureman
*Assistant Examiner* — Michael J Warmflash
(74) *Attorney, Agent, or Firm* — NovoTechIP International PLLC

(57) ABSTRACT

The present invention relates to an apparatus and method capable of performing immediate impedance matching according to changes of a distance and positions between TX/RX coils. The present invention includes: an impedance adjustment unit including a voltage-controlled variable capacitance device; a power detector configured to detect a reflection signal which enters the transmitter or receiver when there is no impedance matching to measure a magnitude of the reflection signal and convert the reflection signal into a DC signal; a multiplier configured to multiply the DC signal with a periodic signal; an integrator configured to accumulate and add a signal in which the DC signal and the periodic signal are multiplied; and a voltage summer configured to sum a signal output from the integrator with a reference voltage to calculate a capacitance control voltage to be applied to the voltage-controlled variable capacitance device.

13 Claims, 5 Drawing Sheets

(56) References Cited

U.S. PATENT DOCUMENTS

| | | | |
|---|---|---|---|
| 2012/0258675 A1* | 10/2012 | Itkin | H04B 1/0458 |
| | | | 455/115.1 |
| 2013/0057080 A1* | 3/2013 | Smith | H02J 50/70 |
| | | | 307/104 |
| 2015/0042173 A1* | 2/2015 | Lee | H02J 7/00308 |
| | | | 307/104 |
| 2016/0176300 A1* | 6/2016 | Bucher | B60L 53/122 |
| | | | 307/104 |
| 2020/0287583 A1* | 9/2020 | Farahvash | H04B 1/40 |
| 2020/0381947 A1* | 12/2020 | Bhandarkar | H02M 3/1582 |
| 2021/0099016 A1* | 4/2021 | Bhandarkar | H02J 50/12 |

* cited by examiner

ADAPTIVE IMPEDANCE MATCHING APPARATUS AND METHOD FOR WIRELESS POWER TRANSFER

CROSS-REFERENCE TO RELATED APPLICATIONS

This application claims the benefit under 35 U.S.C. § 119(a) of Korean Patent Application No. 10-2020-0175910, filed on Dec. 15, 2020 in the Korean Intellectual Property Office, the entire disclosure of which is incorporated herein by reference for all purposes.

BACKGROUND OF THE INVENTION

1. Field of the Invention

The present invention relates to a wireless power transfer or wireless charging technology using a magnetic resonance method, and an impedance matching technology between transmitter (TX) and receiver (RX) coils.

2. Discussion of Related Art

A magnetic resonance method, which is one of wireless power transfer or wireless charging methods, is a technology for transmitting and receiving energy in a situation in which a transmitter (TX) coil and a receiver (RX) coil are spaced apart from each other as shown in FIG. 1.

Transmission efficiency, which is a core element of wireless charging, greatly varies according to positions or a distance between transmitter (TX)/receiver (RX) coils, and impedance matching is required to achieve maximum transmission efficiency. However, appropriate impedance matching according to the distance or positions is difficult to perform.

Accordingly, a matching circuit or a matching network is required for the impedance matching according to the positions or distance between the TX/RX coils. In the conventional matching network, a passive device is used to perform matching according to positions or a distance, or a variable capacitance device such as a varactor diode or the like is used to adjust a voltage according to the positions or distance condition to perform matching.

However, when the passive device is used, a value of the device is fixed and thus there is a limit to matching according to a situation. Further, when the varactor diode is used, matching suitable for each situation can be performed by changing the voltage, but there is a limitation in that optimal transmission efficiency is not certain and a control voltage should be manually changed. In addition, there is a method of finding an optimal voltage of the varactor diode using a software logic, but there is a limitation in that calibration work is required according to each position or distance and thus a lot of time is taken to find the optimal voltage.

BRIEF SUMMARY OF THE INVENTION

As described above, in the case of wireless charging using a magnetic resonance method, appropriate impedance matching is required according to a distance between transmitter (TX)/receiver (RX) coils. However, in the case of a conventional impedance matching method, there is a limit in responding to a change in the distance or positions between TX/RX coils. Specifically, in the case of wireless charging of an electric vehicle, which is one of the magnetic resonance application fields, since a position of a vehicle, which is a receiving terminal, may not be specified, and charging should be performed as soon as possible, a problem in that impedance matching which achieves immediate and maximum transmission efficiency is required should be solved.

Accordingly, the present invention is directed to providing an impedance matching method capable of achieving maximum transmission efficiency in response to changes in the problem position or distance.

An apparatus and a method capable of performing immediate impedance matching according to changes of a distance and positions using a feedback loop to achieve maximum transmission efficiency are provided.

Specifically, according to an aspect of the present invention, there is provided an impedance matching apparatus for energy transmission between a transmitter and a receiver, comprising: an impedance adjustment unit comprising a voltage-controlled variable capacitance device; a power detector configured to detect a reflection signal which enters the transmitter or receiver when there is no impedance matching to measure a magnitude of the reflection signal and convert the reflection signal into a direct current (DC) signal; a multiplier configured to multiply the DC signal with a periodic signal; an integrator configured to accumulate and add a signal in which the DC signal and the periodic signal are multiplied; and a voltage summer configured to sum a signal output from the integrator with a reference voltage to calculate a capacitance control voltage to be applied to the voltage-controlled variable capacitance device, wherein the impedance adjustment unit adjusts impedance due to a change of the capacitance of the voltage-controlled variable capacitance device by the capacitance control voltage calculated by the voltage summer. Here, the voltage-controlled variable capacitance device of the impedance adjustment unit may be a varactor diode.

Further, according to another aspect of the present invention, there is provided an impedance matching method for energy transmission between a transmitter and a receiver, comprising: detecting a reflection signal which enters the transmitter or receiver when there is no impedance matching to measure a magnitude of the reflection signal and converting the reflection signal into a direct current (DC) signal; multiplying the DC signal with a periodic signal; accumulating and adding a signal in which the DC signal and the periodic signal are multiplied; summing the accumulated and added signal with a reference voltage to calculate a control voltage for impedance adjustment; and adjusting the impedance using the calculated control voltage for impedance adjustment and repeating the above-described processes until the reflection signal is not generated.

Configurations and actions of the present invention will become more apparent through specific embodiments described later in conjunction with the drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF THE INVENTION

Advantages and features of the present invention, and a method of achieving them, will become apparent with reference to preferable embodiments which are described in detail in conjunction with the accompanying drawings. However, the present invention is not limited to the embodiments which will be described below and may be implemented in different forms. The embodiments are only provided to completely disclose the present invention and completely convey the scope of the present invention to those skilled in the art, and the present invention is defined by the disclosed claims. Further, terms used in the description are provided not to limit the present invention but to describe the embodiments. In the embodiments, the singular form is intended to also include the plural form unless the context clearly indicates otherwise. The terms 'comprise' and/or 'comprising' as used herein are used so as not to preclude the presence or addition of at least one other component, step, operation, and/or element other than the stated components, steps, operations and/or elements. Hereinafter, preferable embodiments of the present invention will be described in detail with reference to the accompanying drawings. In the description of the embodiments, when detailed descriptions of related known components or functions may obscure the principle of the present invention, the detailed descriptions thereof will be omitted.

Figure 1:
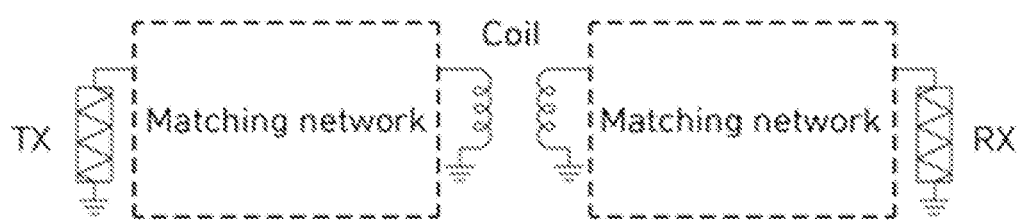
FIG. 1 is a conceptual diagram of energy transmission between transmitter (TX)/receiver (RX) coils of a general magnetic resonance method.
Figure 2:
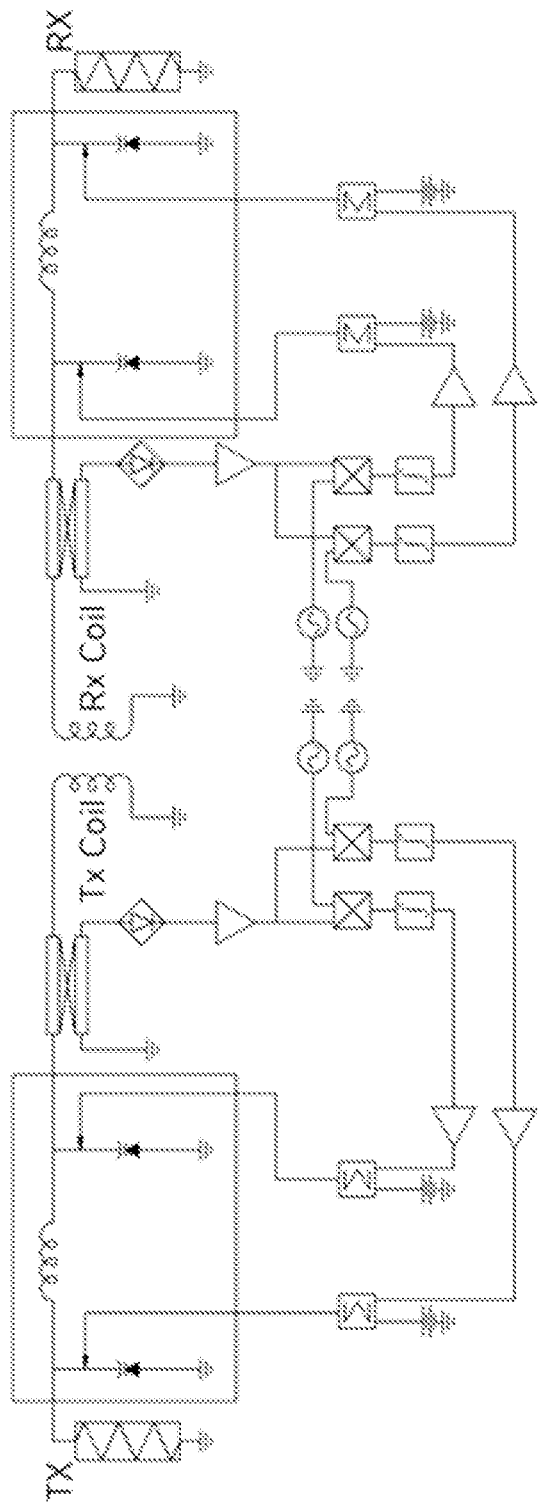
FIG. 2 is a TX and RX adaptive impedance matching circuit diagram according to the present invention.

It is difficult to perform appropriate impedance matching according to a distance or positions, and an adaptive impedance matching circuit in FIG. 2 is proposed to improve this. In order to simplify descriptions in FIG. 2, the principle of a signal flow will be described with reference to FIG. 4, which is a matching circuit diagram for a transmitter (TX) coil. Since a matching circuit for a receiver (RX) coil has the same configuration as the circuit diagram in FIG. 4, descriptions thereof will be omitted.

Figure 3:
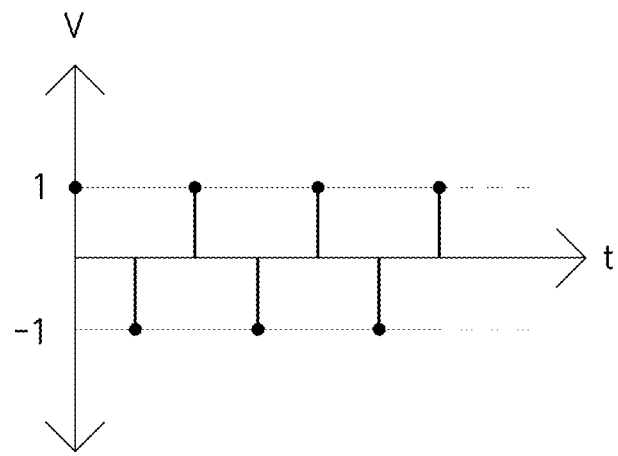
FIG. 3 is an exemplary diagram of an impulse signal used as a periodic signal.
Figure 4:
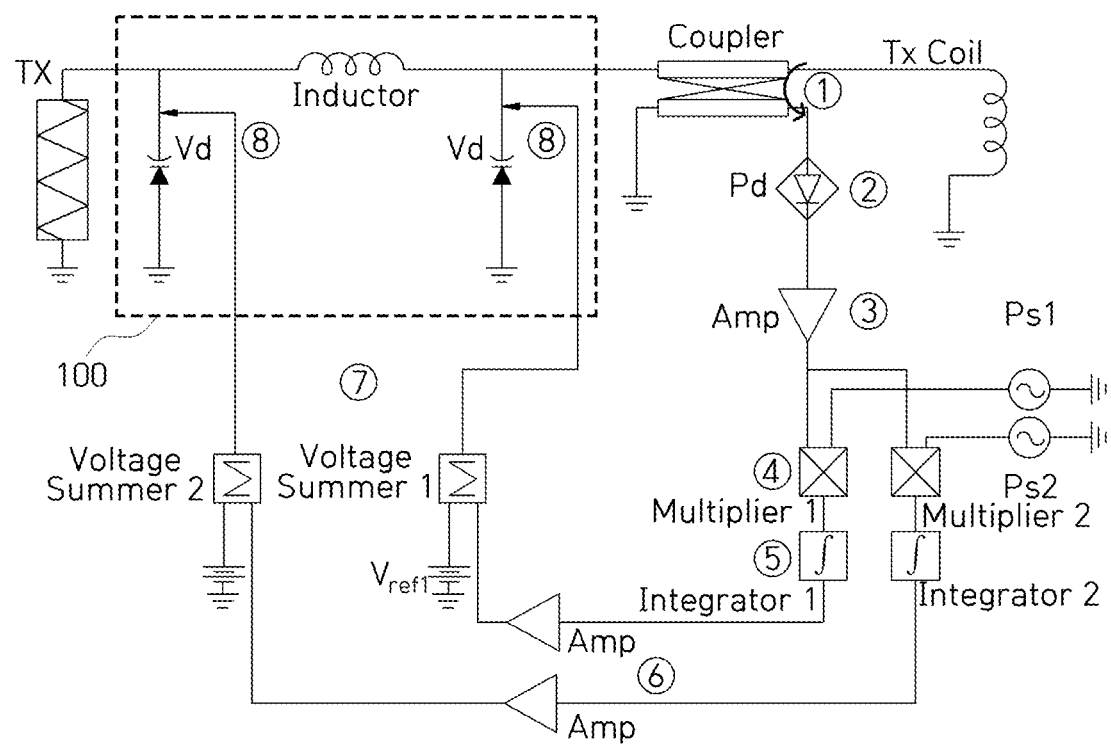
FIG. 4 is an impedance matching circuit diagram for the TX coil among the circuits in FIG. 2.

For better understanding, it is assumed that a periodic signal (Ps) used in FIG. 4 uses plus and minus impulse periodic signals as shown in FIG. 3 (a period of the periodic signal is in nsec (nanosecond) units). Further, Vref1 and Vref2 refer to initial start voltages.

In the circuit in FIG. 4, a dotted line block 100 is an impedance adjustment circuit using a voltage-controlled variable capacitance device and an inductor. FIG. 4 illustrates that an inductor and a varactor diode Vd which is a variable capacitance device, are used in the impedance adjustment circuit 100, and the impedance adjustment circuit 100 is configured by two varactor diodes Vd and one inductor.

Figure 5:
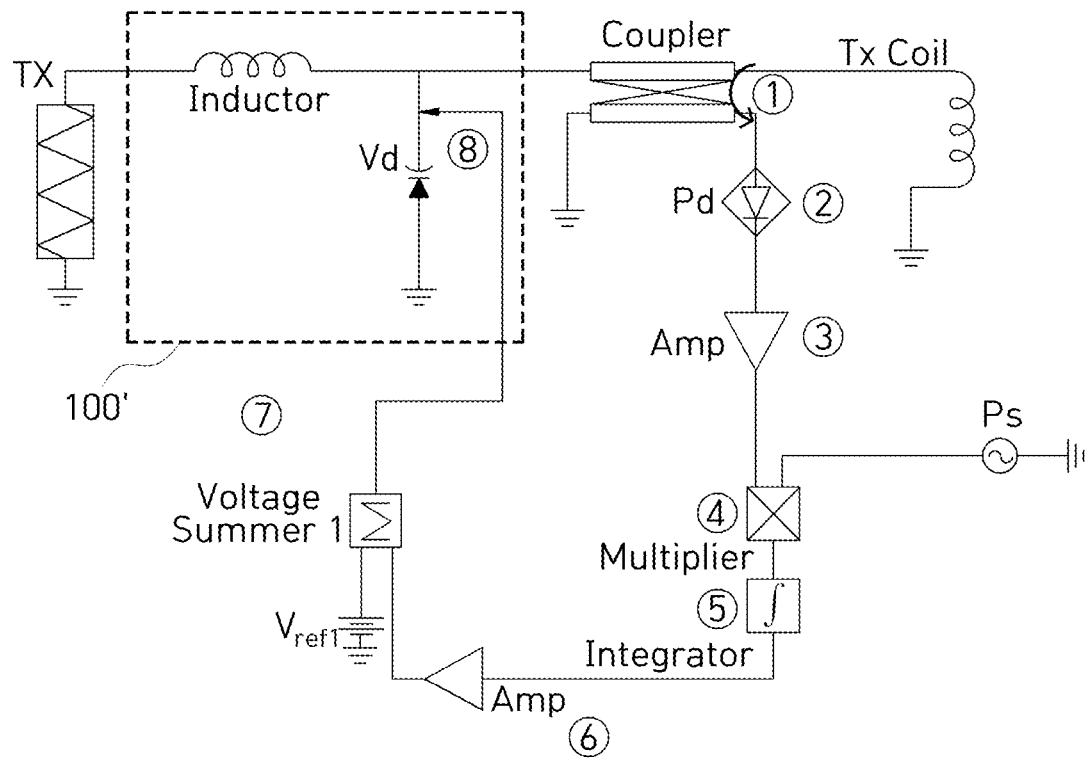
FIG. 5 is an impedance matching circuit diagram in which the circuit in FIG. 4 is simplified.

Hereinafter, for better understanding, an embodiment of the invention will be described with respect to an impedance adjustment circuit 100' composed of one varactor diode and one inductor, which is more simplified as shown in FIG. 5.

When there is no impedance matching during signal transmission and reception through the coils, a reflection signal (miss-matching signal) is coupled through a coupler and introduced. In this case, the reflection signal is an alternating current (AC) signal.

The reflection signal (AC signal) is detected through a power detector (Pd) and converted to a direct current (DC) signal (to measure magnitude of the reflection signal thereafter).

The converted DC signal is amplified through an amplifier (Amp) (to increase the signal using the amplifier as the magnitude of the signal is small even when the impedance is miss-matched).

The amplified DC signal is multiplied with the periodic signal (Ps) using a multiplier. As assumed above, in the present embodiment, an impulse signal is used as Ps for the description, but in actual application, a square wave or sine wave may also be used. However, plus and minus durations should be of the common magnitude.

Previous signals are continuously added to the multiplied signals by an integrator (the integrator performs the summing of the previous signals).

An output signal of the integrator is amplified by the amplifier (Amp).

The amplified signal is summed with a reference voltage, that is, a start voltage Vref by a voltage summer, and is calculated as a capacitance control voltage of the varactor diode Vd.

Since the calculated capacitance control voltage is applied to the Vd, and a capacitance of the Vd is changed according to this voltage, the impedance adjustment circuit 100' performs an impedance control action. The above-described feedback loop is repeatedly executed until no reflection signal is generated or detected from a port of the TX (or RX) (that is, until an optimal capacitance control voltage is found).

The feedback loop is executed in various ways according to the period of the periodic signal Ps. The descriptions of the above are as follows.

Figure 6:
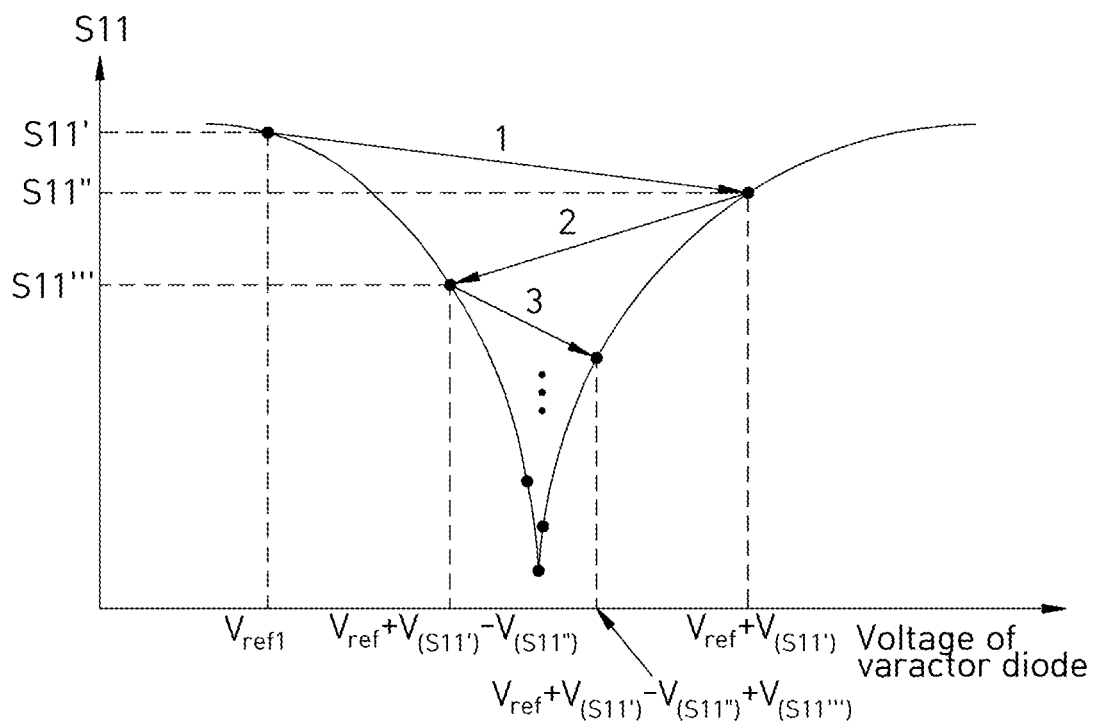
FIGS. 6 and 7 are explanatory diagrams of an action of a TX and RX adaptive impedance matching apparatus according to the present invention.
Figure 7:
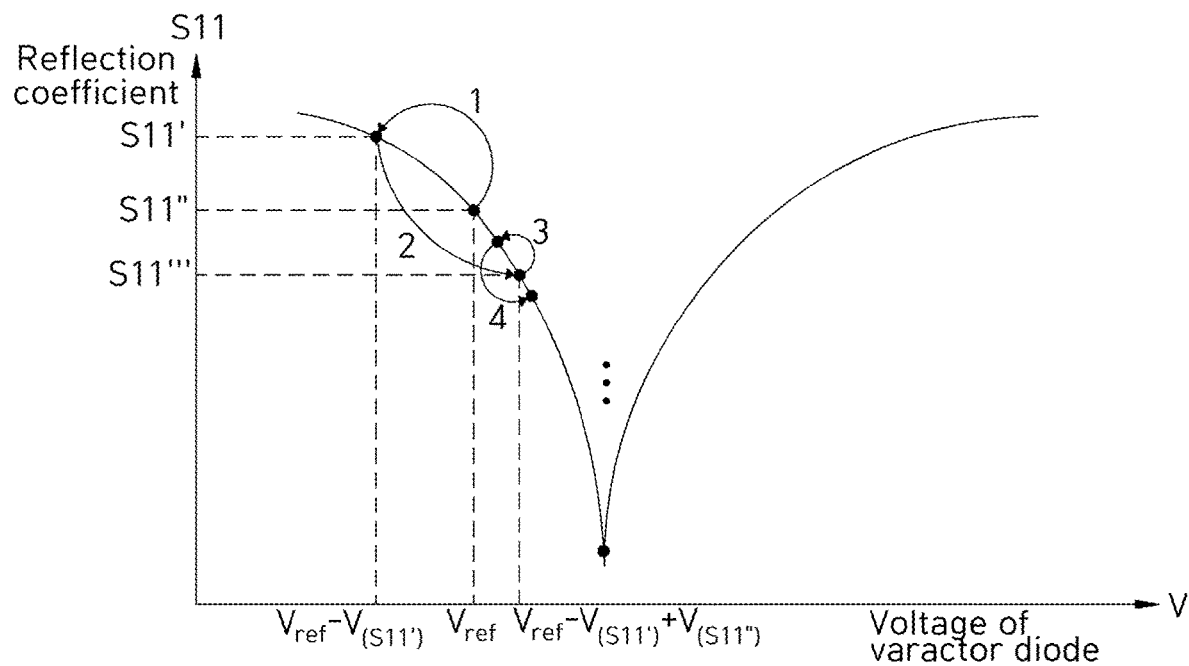

FIGS. 6 and 7 are reflection coefficient graphs for describing how the circuit in FIG. 5 performs the impedance matching according to the periodic signal.

In FIG. 6, when an initial Vref voltage is applied as a capacitance control voltage to the varactor diode and the impedance matching is not perfect matching, a reflection signal referred to as S11' is generated or detected. The reflection signal S11' is converted to a voltage V(S11'), and this voltage is multiplied with an amplitude value of a (+1) duration of the periodic signal Ps, and then Vref+V(S11') added with the Vref by the voltage summer is applied to the varactor diode as the capacitance control voltage. Then, a reflection signal S11" is generated or detected again, and is multiplied with an amplitude value of a (−1) duration of the Ps and added with the Vref, to be Vref+V(S11')−V(S11"). In this case, since S11' is greater than S11", an amount of a subsequent reflection signal changes less than the voltage of the initial reflection signal, and thus an amount of change continues to decrease, finally, the amount of change of the reflection signal approaches 0, and the impedance matching is completed. That is, the magnitude of the reflection signal shown in the graph in FIG. 6 decreases in the order of 1→2→3→ . . . .

A case shown in FIG. 7 is a case in which the impedance matching is performed in a different aspect from the case in FIG. 6. After the voltage of the reflection signal S11' generated by the impedance mismatching is multiplied with the amplitude value of the (−1) duration of Ps, the voltage of the reflection signal S11' is added with the Vref to become Vref−V(S11') and is applied to the varactor diode as the capacitance control voltage. Then, the reflection signal S11" is generated or detected again, and the voltage detected therefrom is multiplied with the amplitude value of the (+1)

duration and summed with Vref to acquire a capacitance control voltage of Vref−V(S11')+V(S11"). In this case, since S11' is greater than S11", an amount less than an amount of initial voltage changes, finally, the voltage changes until an amount of reflection approaches 0. Even in this case, since S11' is greater than S11", the amount of the subsequent reflection signal changes less than the voltage of the initial reflection signal, and thus the amount of change continues to decrease, finally, the amount of change of the reflection signal approaches 0, and the impedance matching is completed. That is, the magnitude of the reflection signal shown in the graph in FIG. 7 decreases in the order of 1→2→3→ . . . .

The above-described aspects of performing the impedance matching by the periodic signal are examples of the case in which the impulse periodic signal is used, and since the actual periodic signal is a continuous signal, a voltage change is continuous rather than discrete as in the case in FIGS. 6 and 7. Since the actual periodic signal varies with plus and minus in nsec units, it can be considered that real-time impedance matching is actually performed.

An operation will be described as follows with reference to FIG. 4, which is a circuit in which the impedance adjustment circuit 100 is composed of two varactor diodes and one inductor, again. In this case, impedance matching in a wider region may be performed compared to the circuit of FIG. 5 by using two varactor diodes. Since an overall impedance matching action is the same as in the case in FIG. 5, a brief description will be given hereinafter.

When there is no impedance matching during signal transmission and reception through coils, a reflection signal (miss-matching signal) is coupled through a coupler and introduced. In this case, the reflection signal is an alternating current (AC) signal.

The reflection signal (AC signal) is detected through a power detector (Pd) and converted to a DC signal (to measure the magnitude of the reflection signal thereafter).

The converted DC signal is amplified through an amplifier (Amp) (to increase the signal using the amplifier as the magnitude of the signal is small even when the impedance is miss-matched).

The converted DC signal is multiplied with a periodic signal 1 using a multiplier 1, and is multiplied with a periodic signal 2 using a multiplier 2.

Previous signals are continuously added by respectively inputting the multiplied signals to integrators 1 and 2 (the integrators perform the summing of the previous signals).

Output signals of the integrators 1 and 2 are respectively amplified by amplifiers 1 and 2 (Amps 1 and 2).

The amplified signals are respectively summed with reference voltages 1 and 2 (Vref 1 and Vref 2) using voltage summers 1 and 2.

The summed voltages are respectively applied to varactor diodes 1 and 2 (Vd 1 and 2) as a capacitance control voltage. The above-described feedback loop is repeatedly executed until no reflection signal is generated or detected from a TX (or RX) port (that is, until an optimal capacitance control voltage is found).

According to the present invention, maximum transmission efficiency becomes possible through appropriate impedance matching according to the positions or distance, and time-saving effects can be acquired through an immediate response. In addition, an improvement in the convenience of reducing a wireless charging time due to optimal transmission efficiency and time saving can be expected.

Although the present invention has been described in detail through preferable embodiments of the present invention, those skilled in the art may understand that the present invention may be embodied in specific forms other than contents disclosed in the specification without changing the technical spirit or essential features of the present invention. The above-described embodiments should be understood as being exemplary and not limiting. Further, the scope of the present invention will be indicated by the appended claims rather than the above-described detailed description, and all possible changes or modifications in forms derived from the scope of the claims and equivalents thereof should be understood as being within the scope of the present invention.

What is claimed is:

1. An impedance matching apparatus for energy transmission between a transmitter and a receiver, comprising:
    an impedance adjustment unit comprising a voltage-controlled variable capacitance device;
    a power detector configured to detect a reflection signal which enters a transmitter or receiver when there is no impedance match to measure a magnitude of the reflection signal and convert the reflection signal into a direct current (DC) signal;
    a multiplier configured to multiply the DC signal with a periodic signal;
    an integrator configured to accumulate a first signal output from the multiplier; and
    a voltage summer configured to sum a second signal output from the integrator with a reference voltage to calculate a capacitance control voltage to be applied to the voltage-controlled variable capacitance device,
    wherein the impedance adjustment unit is configured to adjust an impedance caused by a change of the capacitance of the voltage-controlled variable capacitance device based on the capacitance control voltage calculated by the voltage summer.

2. The impedance matching apparatus of claim 1, wherein the impedance adjustment unit further comprises an inductor configured to adjust the impedance along with the voltage-controlled variable capacitance device.

3. The impedance matching apparatus of claim 1, wherein the voltage-controlled variable capacitance device comprises a varactor diode.

4. The impedance matching apparatus of claim 1, wherein:
    the voltage-controlled variable capacitance device comprises first and second voltage-controlled variable capacitance devices,
    the multiplier comprises first and second multipliers,
    the integrator comprises first and second integrators,
    the voltage summers comprises first and second voltage summers, and
    the impedance adjustment unit is further configured to adjust the impedance based on two capacitance control voltages calculated by the first and second voltage summers, respectively.

5. The impedance matching apparatus of claim 1, further comprising an amplifier configured to amplify the DC signal converted by the power detector and transfer the DC signal to the multiplier.

6. The impedance matching apparatus of claim 1, wherein opposite durations of the periodic signal are of common magnitude.

7. The impedance matching apparatus of claim 1, further comprising an amplifier configured to amplify the second signal and transfer the amplified second signal to the voltage summer.

8. An impedance matching method for energy transmission between a transmitter and a receiver, the method comprising:
   detecting a reflection signal which enters a transmitter or receiver when there is no impedance match;
   measuring a magnitude of the reflection signal and converting the reflection signal into a direct current (DC) signal;
   multiplying the DC signal with a periodic signal to generate a first signal;
   accumulating the first signal to generate a second signal;
   summing the second signal with a reference voltage to calculate a control voltage; and
   adjusting an impedance based on the calculated control voltage,
   wherein the detecting, measuring, multiplying, accumulating, summing and adjusting are repeated until no reflection signal is detected.

9. The impedance matching method of claim 8, wherein the impedance is adjusted using a voltage-controlled variable capacitance device of which a capacitance is changed by the control voltage.

10. The impedance matching method of claim 9, wherein the voltage-controlled variable capacitance device comprises a varactor diode.

11. The impedance matching method of claim 8, further comprising amplifying the DC signal converted from the reflection signal.

12. The impedance matching method of claim 8, wherein opposite durations of the periodic signal are of common magnitude.

13. The impedance matching method of claim 8, further comprising amplifying the second signal.

* * * * *